United States Patent [19]

Gegenwart et al.

[11] Patent Number: 5,318,928
[45] Date of Patent: Jun. 7, 1994

[54] METHOD FOR THE SURFACE PASSIVATION OF SENSORS USING AN IN SITU SPUTTER CLEANING STEP PRIOR TO PASSIVATION FILM DEPOSITION

[75] Inventors: Rainer Gegenwart, Rödermark; Jochen Ritter, Laubach; Helmut Stoll, Sulzbach; Norbert Weimer, Wetzlar; Hans-Dieter Wurczinger, Bad Vilbel, all of Fed. Rep. of Germany

[73] Assignee: Leybold Aktiengesellschaft, Hanau, Fed. Rep. of Germany

[21] Appl. No.: 897,310

[22] Filed: Jun. 11, 1992

[30] Foreign Application Priority Data

Nov. 11, 1991 [DE] Fed. Rep. of Germany ....... 4136987

[51] Int. Cl.$^5$ ................... H01L 21/00; H01L 21/02; H01L 21/302; H01L 21/463
[52] U.S. Cl. .................... 437/235; 437/238; 437/241
[58] Field of Search ............. 437/235, 238, 241

[56] References Cited

U.S. PATENT DOCUMENTS

| | | | |
|---|---|---|---|
| 4,446,194 | 7/1982 | Candelaria et al. | 428/428 |
| 4,744,863 | 5/1986 | Guckel et al. | 156/653 |
| 4,892,753 | 1/1988 | Wang et al. | |
| 4,960,488 | 10/1990 | Law et al. | 156/643 |
| 5,040,046 | 8/1991 | Chhabra et al. | 357/54 |
| 5,041,303 | 8/1991 | Wertheimer et al. | 427/39 |
| 5,061,514 | 10/1991 | Boeglin | 427/39 |

FOREIGN PATENT DOCUMENTS

| | | |
|---|---|---|
| 3906405 | 1/1990 | Fed. Rep. of Germany. |
| 2016720 | 7/1990 | Japan. |
| 2155496 | 3/1985 | United Kingdom. |

OTHER PUBLICATIONS

Wolf, S., Silicon Processing for the VLSI Era, vol. 1, p. 520.
Chang, Novel Passivation Dielectrics-The Boron- or Phosphorus-doped Hydrogenated Amorphous Silicon Carbide Films, J. Electrochem. Soc.: Sol. State Sci and Tech., Feb. 1985, vol. 132, No. 2, pp. 418–422.
Nguyen et al, Reaction Mechanisms of Plasma Journal of the Electrochemical Society, vol. 137, No. 7 (1990 pp. 2209–2215.
Peters et al., Integrated Optical Devices, SPIE Proceedings Oct. 28, 1990 vol. 1362, pp. 338–349.
Chin et al., Plasma TEOS Process for Interlayer Dielectric Applications, Solid State Technology Apr. 1988 pp. 119–122.

(List continued on next page.)

Primary Examiner—Brian E. Hearn
Assistant Examiner—B. Everhart
Attorney, Agent, or Firm—Felfe & Lynch

[57] ABSTRACT

The method calls for introducing an inert gas into a tank where a high frequency energy source is applied to internal electrodes for the ignition of a plasma within the tank. The sensor surface is cleaned by sputtering away impurities from the sensor surface by means of plasma particles striking the sensor surface. Next, a monomer containing silicon and a reactive gas are introduced into the tank with continuous throttling of the inert gas feed and maintenance of the plasma, while the electric power characteristics fed into the plasma are being controlled. This leads to the deposition on the sensor surface of a compound composed of particles from the monomer containing silicon and from the reactive gas.

18 Claims, No Drawings

OTHER PUBLICATIONS

Freeman, Properties of Low-Pressure Chemical Vapor Deposited Dielectric Films from Hexamethyllisilazane, J. Vac. Sci. Technol. A 7(3), Jun. 1989, pp. 1446–1450.

Chang, Novel Passivation Dielectrics-The Boron-or Phosphorus-Doped Hydrogenated Amorphous Silicon Carbide Films, J. Electrochem. Soc.: Sol. State Sci and Tech., vol. 132, No. 2, pp. 418–422.

Disposition of High Quality Oxides Using a TEOS Precursor, IBM Tech. Discl. Bull., pp. 235–236, vol. 32, No. 11, Apr. 1990.

Pang, Amor Carbon Films as Planarization Layers Deposited by Plasma-Enhanced CVD, IEEE Elect. Dev. Lett., vol. 11, No. 9, Sep. 1990, pp. 391–393.

Rathbun, Passivating Coating IBM Tech. Disclo. Bull., vol. 26, No. 2, Jul. 1983, p. 588.

Raveh, Characteristics of Radio Frequency Silicon Carbide Films, J. Vac. Sci. Technol. A5, (5), Oct. 1987, pp. 2836–2841.

Rosler, The Evolution of Commercial Plasma Enhanced CVD Systems, Solid State Tech., Jun. 1991, pp. 67–71.

Hey, Ion Bombartment: A Determining Factor in Plasma CVD, Solid State Tech. Apr. 1990, pp. 139–144.

Fung, Micromachining and Micropackaging of Transducers, Elsevier, 1985, pp. 184–185.

METHOD FOR THE SURFACE PASSIVATION OF SENSORS USING AN IN SITU SPUTTER CLEANING STEP PRIOR TO PASSIVATION FILM DEPOSITION

BACKGROUND OF THE INVENTION

The invention relates to a method for the electrical and mechanical surface passivation of sensors, e.g., semiconductor sensors, using a vacuum apparatus having a tank provided with connections for gas inlet and outlet lines, an anode and a cathode over which a substrate holding device is mounted for the purpose of coating the sensor with a layer of material by the CVD process, with plasma enhanced deposition, and provided with an apparatus for the measurement and control of the parameters governing the sputtering process, such as gas flow, pressure, and the electrical power input into the plasma.

During the manufacture of electronic components such as sensors, for example, especially semiconductor sensors, microchip components and other highly integrated components to name but a few, it is necessary to protect the outer surface of the body of the component both against external influences and internal short-circuits. Because of the highly detailed, fine grain structure of micromechanical semiconductor sensors, as in the case of pressure sensors, the application of conductors on the sensor surfaces calls for electrically insulating intermediate layers for the prevention of electrical short-circuits to the basic substrate of the sensor. Also in the case of telemetering components exposed to a chemically aggressive atmosphere it is necessary to provide a protective coating to the component so as to improve its stability and resistance to a corrosive environment.

Existing classical coating methods, such as thermal vapor deposition or the sputtering of certain substances, has been used for the purpose of applying such protective and insulating coatings to the base substrate. Disadvantages are high working temperatures which make it impossible to coat heat-sensitive substrate, and the fact that the coating parameters, such as hardness, density, electrical properties, refractive index and the composition of the coating, can be controlled only to a limited extent.

For the low-cost production of coatings on such substrate in large numbers, there is also a need for a simple process under stable conditions to achieve the desired results.

The invention is addressed to the problem of devising a method for the electrical and mechanical surface passivation of sensors, such as semiconductor sensors, using a vacuum apparatus, such that the protective coatings that can be produced by the method of the invention can be created with high stability and repeatability, as well as with high rates of deposition, on a large industrial scale. Furthermore, the coatings are to have a controllable high density, low surface roughness, high strengths of adhesion and great resistance to corrosion. Furthermore, the working materials involved in the coating process are to be inexpensive and have environmentally acceptable properties.

SUMMARY OF THE INVENTION

In accordance with the invention, a method is specified for the electrical and mechanical surface passivation of sensors, such as semiconductor sensors. The method uses a vacuum apparatus with a tank having connections for gas inlet and gas outlet lines, an anode and a cathode over which a substrate holding device is mounted for the creation of a coating of the sensor with a layer of material deposited by the CVD process with plasma-enhanced coating deposition. Furthermore, means are provided for the measurement and control of the process parameters controlling the sputtering process, such as gas flow, pressure, and the electrical power put into the plasma. The method steps call for, in a first step, introducing an inert gas into the tank and applying a high frequency AC power source to the electrodes in order to ignite a plasma in the tank. A second process step provides for the cleaning of the sensor surface by sputtering impurities away from the sensor surface by means of plasma particles impinging upon the sensor surface, typically Argon ions. In a third process step, a monomer containing silicon and a reactive gas are introduced into the tank with continuous throttling of the infeed of the inert gas, while the plasma is sustained. For the control of the electrical power put into the coating process, all of the necessary electrical characteristics are measured. As a consequence of the electrical and thermal conditions on the substrate surface, a compound formed from the siliceous monomer and the reactive gas becomes deposited thereon.

The CVD (chemical vapor deposition) process, well known in the art, which in its application according to the invention is substantially the same as a plasma-enhanced gas phase deposition, has the advantage over the other coating depositing processes of assuring completely isotropic deposits on textured or curved substrate surfaces. Also, process temperatures of less than 150 degrees centigrade make it possible to coat plastics, for example, or sensitive electronic components unable to withstand great thermal stress.

The application of highly insulating coatings on metal supports onto which additional coatings, conductive or insulating or combined, are applied, is an essential requirement for the later production of a sensor, e.g., a pressure sensor or a strain gauge. It is important that the membranes, sometimes gossamer thin, which generally can be produced by the means of micromechanics, are able only to withstand only slight mechanical, thermal and chemical stresses which the coating process may not exceed. It is therefore important when coating such structurally sensitive devices to choose a process which will apply such insulating coatings very gently. At the same time, however, the insulating coatings must satisfy stringent requirements. Especially important are a high density, high breakdown strength, low surface roughness, plus great strength of adherence and resistance to corrosion.

DETAILED DESCRIPTION OF THE PREFERRED EMBODIMENT

The method according to the invention provides for a sputtering process for cleaning the substrate surface on which the insulating coating is to be deposited, which removes from the substrate surface all of the contaminants deposited on it, such as surface moisture. This involves essentially argon ions which are formed from the argon filler gas introduced into the tank enclosure and strike against the substrate surface. The substrate to be coated is in that case disposed directly adjacent to the cathode surface, which is at a negative potential with respect to the tank enclosure which corresponds to the grounded anode. The electrical potential of the substrate is at that time not fixed, so that it can be considered as "floating". Between the cathode and the anode a high frequency electrical power source of about 13.56 MHz is applied.

In the next step, monomers and a reactive gas such as oxygen or nitrogen, for example, are added to the plasma that forms between the electrodes and consists mostly of argon ions. The plasma, meantime, is sustained by constant control of the electrical power put into it.

The materials that deposit themselves on the substrate are thus admitted into the tank enclosure in the form of gas, dissociated in a high-frequency discharge, and deposited on the substrate. They can then react to form oxides or nitrides with the reactive gases.

By the selection of the coating parameters of gas pressure within the enclosure and the gas composition, which are controlled by the flow of the gas, and also of the power put into the plasma, any desired variation of the coating properties is possible. Silicon monomer compounds which combine with the additive gas to form $SiO_2$, SiC, and $Si_xO_yC$ coatings have proven especially advantageous. Suitable monomer compounds are preferably tetraethoxysilanes (TEOS), hexamethyldisilazanes (HMDS), tetramethyldisilanes (TMS) and simple silanes.

With this method it has been possible for the first time to apply to mechanically and thermally highly sensitive substrate strongly adherent, highly insulating coatings which despite the more severe process conditions result in mechanically and chemically resistant coatings, also in the sense of protective coatings. Thus, in addition to the applications mentioned above, protective coatings for lenses, the surface-hardening of plastics, dielectric coatings for microelectronics, and applications in the field of integrated optics can be considered.

Although the present invention has been shown and described with respect to preferred embodiments, various changes and other modifications which are obvious to persons skilled in the art to which the invention pertains are deemed to lie within the spirit and scope of the invention.

We claim:

1. A method for the electrical and mechanical surface passivation of a semiconductor sensor surface, using a sputtering apparatus composed of a vacuum apparatus having a tank with connections for gas inlet and gas outlet lines, anode and a cathode over which a substrate holding device is mounted, and measuring and control means for the process parameters for determining the sputtering process, said method comprising the following steps:

a) introducing an inert gas into said tank;
b) applying a high frequency electrical source between said anode and cathode to ignite a plasma comprising positive ions of said inert gas within said tank;
c) cleaning said sensor surface by sputtering away impurities from the sensor surface by means of said positive ions striking the sensor surface;
d) introducing a monomer containing silicon and a reactive gas into the tank with continuous throttling of the feed of the inert gas and maintenance of the plasma;
e) controlling the electrical energy applied to said plasma so that a compound formed from the silicon-containing monomer and the reactive gas is deposited onto the sensor surface.

2. Method according to claim 1, wherein the material coating is electrically highly insulating.

3. Method according to claim 1 wherein the material coating is chemically inert toward acids, lyes and aggressive gases.

4. Method according to claim 1, wherein said reactive gas is selected from the group consisting of molecular oxygen, molecular nitrogen, oxygen compounds and nitrogen compounds.

5. Method according to claim 1 wherein the resulting insulating coating consists of $SiO_2$.

6. Method according to claim 1, wherein the resulting insulating coating consists of SiC.

7. Method according to claim 1 wherein the resulting insulating coating consists of the compound $Si_xO_yC$.

8. Method according to claim 1 wherein the maximum process temperature is 150 degrees centigrade.

9. Method according to claim 1, wherein the sensor surface to be coated is metallic and conductive.

10. Method according to claim 1, wherein the sensor surface to be coated is made of plastic.

11. Method according to claim 1, wherein said silicon monomer is selected from the group consisting of tetraethoxysilane (TEOS), hexamethyldisilazane (HMDS), tetramethyldisilane (TMS) and silane.

12. Method according to claim 1, wherein the electrical power applied is minimized during the transition from pure filler gas atmosphere in said tank to said silicon monomer-additive gas mixture.

13. Method according to claim 1 wherein said semiconductor surface to be passivated by said method is a pressure sensor.

14. Method according claim 1, wherein said semiconductor surface to be passivated is a strain gauge.

15. Method according to claim 1, wherein said high power, high frequency electrical energy source is applied to said electrodes at about 13.56 MHz.

16. Method according to claim 1, wherein said inert gas is argon, whereby said positive ions striking said sensor surface are Ar+ ions.

17. Method according to claim 1 wherein said semiconductor sensor surface to be vapor-deposited with said method is a mechanically sensitive sensor element.

18. A method as in claim 1 wherein said reactive gas consists of at least one of oxygen and nitrogen.

* * * * *